United States Patent [19]

Orio

[11] Patent Number: 4,533,445

[45] Date of Patent: Aug. 6, 1985

[54] U.V. CURABLE COMPOSITION

[75] Inventor: Alfred P. Orio, Derry, N.H.

[73] Assignee: Shipley Company Inc., Newton, Mass.

[21] Appl. No.: 511,224

[22] Filed: Jul. 6, 1983

[51] Int. Cl.³ .................. C08J 3/28; C08G 2/02; C08L 33/08; C08L 33/10

[52] U.S. Cl. .................. 204/159.19; 204/159.16; 204/159.21; 204/159.23; 430/284; 430/285; 430/288; 524/789; 524/853; 524/854; 526/313

[58] Field of Search .................. 204/159.15, 159.16, 204/159.19, 159.23, 159.21; 524/853, 854, 789; 526/313; 430/288

[56] References Cited

U.S. PATENT DOCUMENTS

| | | | |
|---|---|---|---|
| 3,879,204 | 4/1975 | Gervay | 430/259 |
| 3,958,996 | 5/1976 | Inskip | 430/288 |
| 4,064,287 | 12/1977 | Lipson et al. | 427/53 |
| 4,180,474 | 12/1979 | Schuster et al. | 204/159.23 |
| 4,264,483 | 4/1981 | Laufer et al. | 204/159.23 |
| 4,425,209 | 1/1984 | Saeki et al. | 204/159.23 |

OTHER PUBLICATIONS

*Radiation Curing*, 5 (1), p. 11, Feb. 1978.

*Primary Examiner*—Allan M. Lieberman
*Attorney, Agent, or Firm*—Robert L. Goldberg

[57] ABSTRACT

A U.V. curable coating composition useful for electronics manufacture comprising an acrylated or methacrylated oligomer and a mixture of a multifunctional and monofunctional monomer. When further combined with an elongated filler, the U.V. curable composition is suitable for use as a permanent solder mask that adheres to metals conventionally used in electronics manufacture following wave soldering.

32 Claims, No Drawings

U.V. CURABLE COMPOSITION

BACKGROUND OF THE INVENTION

1. Introduction

This invention relates to new and improved coatings useful in electronics manufacture such as in the fabrication of printed circuit boards. More specifically, the invention relates to liquid photopolymerizable compositions which may be readily applied to a substrate and U.V. cured to form adherent coatings useful for a variety of purposes, and in one embodiment finds use as a solder mask characterized by unique adhesion to copper and other metals following wave soldering.

2. Description of the Prior Art

In increasing frequency, electronic components such as printed circuit boards are coated with organic coatings at some point during their manufacture. One such coating, used as a solder mask, is a permanent organic coating which is typically screen printed over an entire circuit pattern, leaving open points such as component insertion holes, which subsequently take solder. The use of a solder mask provides advantages of insulation of the circuit tracers; hermetic sealing; resistance to soldering and solder fluxes; aesthetics; use as a base for legend inks; and resistance to solder bridging.

To provide the necessary properties, most solder masks commercially used have been heat curable thermosetting, polymer systems. However, the industry is now turning to polymer systems that cure by exposure to ultraviolet radiation. U.V. curing provides savings in terms of energy consumption, equipment, space and time. U.V. curable coatings are essentially 100 percent solids that offer no pollution problems due to solvent emissions. They are easy to use because the ink will not dry on the screen in a room suitably equipped with yellow lighting and they provide improved thickness uniformity with concomitant improved protection over the edges of conductor lines. The price per kilogram of U.V. curable coating is generally greater than conventional heat-curing systems, but there are overall cost advantages associated with their use for the reasons described above.

Many formulations have been reported in the literature as useful as U.V. curable coatings. Most are based upon acrylated oligomers such as acrylated epoxies, polyesters, polyethers and urethanes. These systems rely upon a photoinduced polymerization mechanism for curing. A typical U.V. curing formulation comprises an oligomer or prepolymer, monomer(s), photoinitiator(s), pigment(s) and other additives. The oligomers or prepolymers are the materials described above. The monomers are typically low viscosity acrylate esters including monoacrylates, diacrylates and some triacrylates. The photoinitiator absorbs the ultraviolet energy and initiates the polymerization of the U.V. curable material. Typical classes of photoinitiators known in the art are the acyloins or acyloin ethers; polyhalogenated materials; and the commonest type which are the aryl ketones. A general description of such materials, and the method of formulating the same, are set forth by Pappas, U.V. Curing; Science and Technology. Technology Marketing Corporation, Connecticut, pages 187 through 202, 1980, incorporated herein by reference.

A patent believed to encompass a commercially available U.V. curable solder mask formulation is U.S. Pat. No. 4,064,287, incorporated herein by reference. The invention is said to reside in the use of a formulation free of solvent. The formulation comprises as essential components a photopolymerizable material containing an aryloxyalkyl acrylate oligomer; a liquid photopolymerizable monomer referred to in the patent as a diluent containing at least one terminal ethylenic group; and a free radical generating addition polymerizing initiating system activatable by actinic radiation. Numerous examples of each of the above-identified classes of essential ingredients are set forth in the patent.

Solder masks prepared in accordance with the teachings of the above patent and other solder masks available in the market suffer certain disadvantages. For example, they are typically applied to a printed circuit board by screening in a pattern designed to prevent unwanted soldering on portions of the conductor lines. For example, a simple etched printed circuit consists of copper conductors on a plastic substrate such as an epoxy G-10 laminate. After the solder mask has been applied, electronic components are mounted on the board through the holes. The wire leads then have to be connected to the copper conductors, which typically is performed by wave soldering or float soldering, during which operation hot molten solder (typically about 260° C.) is applied to the wire leads and the exposed sections of the copper conductors, thereby forming a fused solder connection. During this soldering operation, the entire surface area of the printed circuit board is exposed to hot molten solder. Since the coefficient of expansion of copper metal is so different from the coefficient of expansion of the solder mask, tremendous strain is placed on the adhesion of the solder mask to the copper conductors which often leads to delamination of the solder mask from the copper conductor. In addition, the cured mask often does not have sufficient mechanical strength to withstand abrasion that might be encountered in a typical manufacturing process and the coatings are often brittle, whereby minor flexing of the board may result in fracture of the coating and loss of protection. Poor adhesion or failure to withstand abrasion can result in delamination of the solder mask and ultimate failure of a printed circuit.

SUMMARY OF THE INVENTION

The subject invention is directed to an organic coating material for electronics manufacture which can be used for a variety of purposes including use as a conformal coating, as a stop-off mask and in one embodiment, finds use as a U.V. curable solder mask that exhibits excellent adhesion to many metals used in electronics manufacture. The formulation of the coatings of the invention comprise an acrylated oligomer together with a combination of monomers comprising a multifunctional alkoxylated acrylate or methacrylate and a monofunctional ethylenically unsaturated compound having a single terminal ethylenic group. In the preferred embodiment of the invention, where the coating composition is to be used as a solder mask, the formulation also contains a plate-like or fibrous filler for toughness.

The coatings of the invention are characterized by excellent adhesion to the metals used in printed circuit manufacture. When the coatings are used as a solder mask, they have an ability to sustain strong adhesion to copper following a soldering operation such that an applied solder mask passes the "cross-hatch" adhesion test, not only before soldering, but also following soldering. It is believed that this ability is unique to the solder masks of this invention.

In addition to the above, the solder masks possess strong adhesion to reflowed solder. Often, copper conductors are overcoated with reflowed solder prior to the application of a screened solder mask. During soldering, the reflowed solder beneath the solder mask becomes molten, causing adhesion problems between the solder and the overlying mask. Many of the formulations within the scope of this invention are able to retain cross-hatch adhesion to reflowed solder conductor lines both before and after a soldering operation.

DESCRIPTION OF THE PREFERRED EMBODIMENTS

Throughout this specification, the phrase "cross-hatch adhesion" is used to define the adhesion of a coating to a substrate. The phrase refers to a test conventionally used to measure adhesion of a coating to a substrate in printed circuit manufacture. The test comprises cutting a coating with a razor blade making cuts an inch long separated from each other by 2 mm. Cuts are made first in one direction and then these cuts are cross-hatched with cuts perpendicular to the original cuts. After the film has been cut, it is lightly brushed with a soft brush to remove any flaked particles of coating. Then pressure sensitive tape measure ½ by 2 inches is applied to the coating. The tape is then rapidly removed by manual force applied approximately perpendicular to the surface of the substrate. The tape is visually examined for evidence of delamination. If less then about 5 percent of the total coating beneath the tape is found on the tape, the coating has passed the cross-hatch adhesion test.

The binders used in the U.V. curable composition of the invention are acrylated and methacrylated oligomers such as acrylated epoxies, polyesters, polyethers and urethanes. Materials of this nature are described in Radiation Curing, 4, (3) 4 (August 1977) incorporated herein by reference. The oligomers comprise medium molecular weight resins reacted with acrylic or methacrylic acid. If an epoxy oligomer is used, the reaction with the acid can create a second hydroxyl group which may be further reacted with an isocyanate to yield a urethane epoxy acrylate, if desired. The preferred oligomers are the aryloxyalkyl acrylates that are the reaction products of an epoxy compound and acrylic or methacrylic acid. Such materials are commercially available under the tradenames of "Epocryl" (Shell Chemical Company), "Derakane" (Dow Chemical Company), "Nupol" (Freeman Chemical Company), "SR-348" and "SR-349" (Sartomer Resins Company) and "Celrad 3700 and 3701" (Celanese Plastics and Specialties Company).

The preferred oligomers are aryloxyalkyl acrylates conforming to the following general formula:

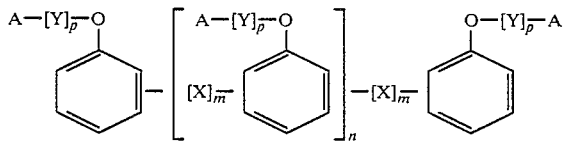

wherein X may be methylene, an alkyl-substituted methylene group, a dialkyl-substituted methylene group, a carbonyl group, a sulfide, a sulfoxide, a sulfone, an amine, an alkyl-substituted amine, an alkalene ether, etc., wherein the alkyl group in each of the aforesaid may have from 1 to 8 carbon atoms, or any combination thereof; Y may be thyl, lower alkyl or hydroxyalkyl group where each alkyl group has up to 8 carbon atoms; A may be an unsaturated acryloxy group having from 3 to 18 carbons, preferably acryloxy or methacryloxy; n may be 0 through 20; m may be 0 or 1; and p may be 0 or 1.

The aromatic rings in the above formula may be substituted with 1 to 4 additional substituents such as chlorine or bromine. The most preferred oligomer in accordance with the invention is the diacrylate ester of a Bisphenol A epoxy resin.

The monomer used in combination with the oligomer is a combination of multifunctional acrylate and a monofunctional ethylenically unsaturated compound containing one terminal ethylenic group.

The multifunctional acrylate is conventionally used in such formulations, but modified by alkoxylation to improve various properties of the cured coating. Alkoxylation improves the flexibility of the cured coating whereby fracture upon flexing is reduced and enhances adhesion of the cured coating to metals.

Alkoxylation of the multifunctional acrylate is accomplished following generally the procedures of U.S. Pat. No. 4,180,474, or European published patent application Ser. No. 82-102,533, both incorporated herein by reference. The processes comprise alkoxylation of certain polyols and the formation of acrylates and methacrylates therefrom. With minor modification, the process of the patent and application may be practiced to alkoxylate other polyols which can then be reacted with acrylic or methacrylic acid. In general, the method comprises a first step of alkoxylating a polyol by known methods such as described in *High Polymers*, Volume III, Polyether, Part I, Interscience Pubishers (1963). The method involves slowly adding an alkylene oxide to a solution of a polyol in the presence of a catalyst such as sodium methylate. Following alkoxylation of the polyol, the acrylic and methacrylic acid esters of the alkoxylation product are produced by known methods such as, for example, direct esterification with acrylic or methacrylic acid or by azeotropic esterification with a suitable solvent such as water as an entraining agent in the presence of a catalyst and stabilizers. The products may also be produced by transesterifying acrylic or methacrylic acid esters in the presence of a suitable catalyst such as disclosed in U.S. Pat. Nos. 2,101,107 and 2,468,094, both incorporated herein by reference.

The alkoxylated multifunctional acrylates in accordance with the invention generally conforms to the structure:

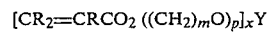

[CR$_2$=CRCO$_2$ ((CH$_2$)$_m$O)$_p$]$_x$Y where R is hydrogen or methyl; m is a positive integer of from 1 to 4; p is a positive number of 1 or greater; Y is the residue of a polyol having at least z hydroxyl groups where z is at least 3; and x is at least 2, but not greater than z. In the above structure, x is preferably 3 and p and x need not be whole numbers as they represent the average degree of substitution as would be apparent from a review of the above-cited reference.

Examples of polyols that may be alkoxylated and esterified with acrylic or methacrylic acid, for purposes of this invention, include acrylates and methacrylates of 1,2,4-butanetriol, polyethylene glycols of molecular weight of from 200 to 500; trimethylolpropane; pentaerythritol; etc. Of the aforesaid, the triacrylate of propoxylated trimethylolpropane is preferred.

The coating compositions of this invention also include a monofunctional ethylenically unsaturated compound containing one terminal ethylenic group. The monofunctional acrylates conventionally used in U.V. curable coating compositions, such as disclosed in U.S. Pat. No. 4,064,287, supra, are suitable, but the compound preferably contains an alkyl or cycloalkyl group having from 4 to 10 carbon atoms, excluding the terminal ethylenic group. It has been found that an increase or decrease in the number of carbon atoms of the alkyl group may result in a loss of adhesion between the coating and metal over which the coating is applied. Ethylenically unsaturated compounds having terminal ethylenic groups are conventionally used in U.V. curable coating compositions and examples falling within the requirements set forth above would be readily known to those skilled in the art. Preferred compounds comprise 2-ethyl butyl acrylate, dicyclopentenyl methacrylate, 2-ethyl hexyl acrylate, cyclohexyl acrylate, isodecyl acrylate and N-vinyl pyrrolidone.

As is known in the art, to obtain U.V. curing, it is necessary to include a photoinitiator in the formulation of the U.V. curable material. Useful photoinitiators include benzophenones, acyloin ethers, polyhalogenated xanthones, acetophenones and aryl ketones. Examples thereof include 2,2-dimethoxyacetophenone, 2,2-dimethoxy-2-phenylacetophenone, 2,2-diethoxyacetophenone, 2,2-dibutoxyacetophenone, 2,2-dihexoxyacetophenone, 2,2-di(2-ethylhexoxy) acetophenone, 2,2-di(chlorophenyl) acetophenone, 2,2-di(nitrophenyl) acetophenone, 2,2-diphenoxy-2-phenylacetophenone, 2,2-dimethoxy-2-methylacetophenone, 2,2-dipropoxy-2-hexylacetophenone, 2,2-diphenoxy-2-ethylacetophenone, 2,2-dimethoxy-2-cyclopentylacetophenone, 2,2-di(2 -ethylhexl)-2-cyclopentylacetophenone, 2,2-diphenoxy-2-cyclopentyl-acetophenone, 2,2-di-(nitrophenoxy)-2-cyclohexylacetophenone; benzoin ethers, such as benzoin isobutyl ether; alyl substituted anthraquinones such as 2-tert-butylanthraquinone; the substituted or unsubstituted polynuclear quinones, such as, 9,10-anthraquinone, 1-chloroanthraquinone, 2-chloroanthraquinone, 2-methylanthraquinone, 2-ethylanthraquinone, octamethylanthraquinone, 1,4-naphthoquinone, 9,10-phenanthraquinone, 1,2-benzanthraquinone, 2,3-benzanthraquinone, 2-methyl-1, 4-naphthoquinone, 2,3-dichloronaphthoquinone, 1,4-dimethylanthraquinone, 2,3-dimethylanthraquinone, 2-phenylanthraquinone, 2,3-diphenylanthraquinone, the sodium salt of anthraquinone alpha-sulfonic acid, 3-chloro-2-methylanthraquinone, and retenequinone.

In addition to one or more oligomers, and the multifunctional and monofunctional compounds, the U.V. curable compositions of the invention may include other additives such as inhibitors, fillers, thixotropic agents, leveling agents, pigments, plasticizers, etc. For example, to obtain a useful screen printing coating, it is desirable that the composition have the appropriate viscosity and thixotropic properties as is known in the art.

The combination of the acrylated oligomer, the alkoxylated multifunctional acrylates, the ethylenically unsaturated compound and the photoinitiator provides a U.V. curable coating composition suitable for a variety of purposes in electronic manufacture. For example, it may be used in printed circuit manufacture as a permanent conformal coating or as a temporary coating, for example, as a stop-off resist. In the preferred embodiment of the invention, filler is added which makes the coating composition suitable for use as a solder mask by enabling the applied solder mask coating to withstand the elevated temperature encountered during soldering, as well as heated solder fluxes, without loss of adhesion to metals used in electronic circuitry.

The filler is preferably elongated to sustain crosshatch adhesion to metals following soldering. Preferred fillers are platy, acicular and fibrous substances. Of the elongated fillers, those having an aspect ratio (length to thickness) of at least 2 to 1 are preferred, preferably an aspect ratio of at least 4 to 1. The preferred fillers are talc and mica. If a sufficient quantity of the above-preferred elongated fillers is included in the solder mask composition, additional fillers of other shapes such as spherical or nodular fillers can be added in significant quantities to the composition. These additional fillers can be utilized for a variety of purposes, such as, promotion of viscosity, dielectrics, thixotropy, surface slip, pigment extension and modification of surface rheology. The elongated filler should comprise a major portion of the filler content—i.e., 50 percent or greater and the additional filler the balance.

The concentration of the ingredients comprising the U.V. curable coating of the invention can vary within rather broad limits. The following table sets forth concentration ranges for a coating composition in accordance with the invention:

| Ingredient | Weight Percent Broad | Weight Percent Preferred |
| --- | --- | --- |
| Oligomer(s) | 30–70 | 49–65 |
| Multifunctional Monomer(s) | 5–35 | 10–29 |
| Monofunctional Monomer(s) | 5–35 | 15–30 |
| Photoinitiator(s) | 1–12 | 2–8 |

The above formulation is useful for a variety of purposes as described above. Other additives such as plasticizers, dyes, etc. are not set forth in the above table, but may be added in minor amount. If the formulation is to be used as a solder mask, the formulation also contains the filler in addition to the other ingredients. The concentration of the filler preferably varies between 10 and 70 weight percent of the total of all of the other components of the formulation and more preferably, between 15 and 40 weight percent. The elongated particles comprise the major portion of the filler. In this respect, a greater proportion of the total filler must be elongated filler at the lower filler contents than at the higher filler contents. For example, as a filler concentration of 10 percent, the filler is preferably all elongated filler while as the 70 percent filler concentration, the nonelongated filler content can approach 50 percent of the total filler.

The preferred embodiment of the invention comprises an oligomer that is a diacrylate ester of a bisphenol A epoxy resin, a propoxylated trimethylol propane having a degree of propoxylation between 2 and 3, a monofunctional acrylate having a $C_4$ to $C_{10}$ alkyl group and talc.

The coatings of this invention are applied to a substrate in conventional manner. For example, if the costing composition is coated over a substrate by screen printing, a quantity is poured onto a screen imaged in a desired geometry. A squeegee is drawn uniformly with even pressure to spread the ink across the entire surface of the screen, thereby transferring the coating composition through an image pattern onto the substrate below. Thereafter, the screen is lifted and the screen removed. Film thicknesses ranging from about 0.2 to 2.0 mils are obtained using this procedure, typically from about 0.5 to 1.5 mils in thickness. The substrate bearing the uncured coating composition is removed and passed through an ultraviolet radiation source. Such sources include carbon arcs, mercury vapor lamps, fluorescent lamps with ultraviolet radiation-emitting phosphors, argon glow lamps, etc. The period of exposure, as should be understood by those skilled in the art, would be dependent upon film thickness, transluscence of the coating composition, light intensity, the distance from the light source to the composition and the temperature of the operation. After exposure, the cured coating may be subjected to a post cure bake if desired.

A process for the manufacture of a printed circuit board by additive techniques, for example, using the U.V. curable coating composition of this invention would comprise starting with a prepared epoxy fiber glass board which is activated by immersion in a suitable electroless metal catalyst, and thereafter applying the U.V. curable composition image-wise through a screen printing process. The coating is quickly cured. A post bake may be desirable for resistance to highly alkaline solutions. Electroless copper is deposited to the thickness required in the desired circuit configuration.

The invention will be better understood by reference to the examples which follow. For all examples, the test utilized 2" by 2" portions of commercial printed circuits with copper conductors (for adhesion tests to copper) and copper conductors coated with reflowed solder (for adhesion tests to solder). For adhesion tests for copper, the copper conductors were degreased and cleaned and coated with solder mask by applying a 1 mil coating through a non-imaged silk screen. For adhesion test to solder, tin-lead electroplate was plated over suitably prepared copper conductors reflowed and cleaned, and coated with solder mask by applying a 1 mil coating through a nonimaged silk screen. In each case, the solder mask coating was cured by conveying the same through a U.V. curing apparatus at a speed of 10 linear feet per minute under 2 mercury vapor lamps capable of providing 200 watts per linear inch. Thereafter, the parts were floated in molten solder at 500° F. for 10 seconds to simulate wave soldering. Adhesion was then determined using the above-described cross-hatch adhesion test. The results set forth in the example are pass/fail results following the above procedures.

EXAMPLE 1

| | |
|---|---|
| Acrylate epoxy oligomer Celrad 3700[(1)] | 40 gm. |
| Multifunctional alkoxylated acrylate Propoxylated trimethylolpropane triacrylate having propoxylation number between 2 and 3 | 12.5 gm. |
| Monofunctional acrylate Cyclohexyl acrylate | 12.5 gm. |
| Photoinitiator Benzophenone | 3.5 gm. |
| Filler Talc | 26.5 gm. |

[(1)]Celrad 3700 is a diacrylate ester of a bisphenol A epoxy resin available from Celanese Plastics and Specialties Company.

The above formulation passed the cross-hatch adhesion test for copper and solder, and therefore is suitable for use as a solder mask in addition to finding use as a dielectric coating.

EXAMPLE 2

The base formulation of Example 1 was prepared without the cyclohexyl acrylate. The following monofunctional acrylates were substituted in the quantities set forth in Example 1.

| | Cross-Hatch Adhesion Test | |
|---|---|---|
| Acrylate | Copper | Solder |
| None | Fail | Fail |
| 2-ethylbutyl methacrylate | Pass | Pass |
| dicyclopentyl methacrylate | Pass | Pass |
| 2-ethylhexyl acrylate | Pass | Pass |
| n-vinyl pyrrolidone | Pass | Pass |
| isodecyl acrylate | Pass | Pass |

EXAMPLE 3

Example 2 was repeated without the monofunctional acrylate, but with the addition of 12.5 extra grams of propoxylated triacrylate. The formulation failed the cross-hatch adhesion test for both copper and solder.

EXAMPLE 4

Example 1 was repeated eliminating the talc. The formulation passed the cross-hatch adhesion test for copper, but not solder. The formulation is thus suitable for use as a dielectric coating and for use as a solder mask over copper circuitry.

EXAMPLE 5

Example 1 was repeated substituting Muscovite mica for talc in the same concentration with the same cross-hatch adhesion properties.

EXAMPLE 6

Example 1 was repeated substituting 7.0 grams of silica for an equivalent amount of talc. The same results were obtained. Replacing a total of 14.0 grams of talc with silica will cause the formulation to fail the cross-hatch adhesion test. The formulation is suitable for use as a dielectric coating.

EXAMPLE 7

Example 1 was repeated eliminating the Celrad 3700. The formulation passed the cross-hatch adhesion test for copper, but would not have the chemical or thermal resistance necessary for use as a solder mask.

EXAMPLE 8

This example illustrates the use of the solder mask of the invention in a process for attaching component leads to a through-hole-plated printed circuit board having reflowed solder over copper conductors. For purposes of the example, a commercially available printed circuit board was used. The board had reflowed solder on the copper conductors and the walls of the holes in a thickness of about 0.3 to 0.5 mils. The solder mask of Example 1 was screened onto the conductor pattern and then U.V. cured, except for the land areas adjacent to holes. Component leads were inserted into holes in the board and the board was then wave soldered in a conventional manner using an activated rosin flux. Wave soldering caused melting of some of the reflowed solder beneath the solder mask. Consequently, the board after this manufacturing step had component leads soldered to it, the solder connections being made to the land areas as well as within the holes. The solder mask prevented soldering to the conductors that were coated with solder mask. Following wave soldering, the printed circuit board was examined for any adverse effects caused by the wave soldering operation. The solder mask of the invention was intact and passed a cross-hatch adhesion test showing that the solder mask still adhered to the reflowed solder conductors beneath it.

EXAMPLE 9

The above test was repeated except that soldering was performed by the solder float method instead of wave soldering. Solder floatation was performed for about 5 seconds with the solder pot temperature maintained at about 260° C. Following the soldering operation, the printed circuit board was examined for adverse effects caused by the solder float operation and it was found that the solder mask was intact and passed the cross-hatch adhesion test, again establishing that the solder adhered to the reflowed solder conductors beneath it.

EXAMPLE 10

This example illustrates the use of the solder mask of the invention in a process for attaching component leads to a printed circuit board having copper conductors that are not coated with reflowed solder plate. Again, a commercially available printed circuit board was used. The solder mask of Example 1 was screened onto the copper conductor pattern and U.V. cured, except the land areas adjacent to the holes. Component leads were inserted into the holes in the board and the board was then wave soldered in a conventional manner using an activated rosin flux. Consequently, the board after this manufacturing step had component leads soldered to it, the solder connections being made through solder on the land areas around the holes. The solder mask prevented soldering to the copper conductors that were coated with solder mask. Following wave soldering, the printed circuit board was examined for adverse effects caused by the wave soldering operation. The solder mask was intact and passed the cross-hatch adhesion test showing that the solder mask adhered to the copper conductors.

EXAMPLE 11

The test of Example 10 was repeated except that soldering was performed by the solder float method instead of wave soldering. Solder floatation was performed for about 5 seconds with the solder pot temperature maintained at about 260° C. Following the soldering operation, the printed circuit board was examined for adverse effects caused by the soldering operation and it was found that the solder mask was intact and passed the cross-hatch adhesion test, again establishing that the solder adhered to the copper conductors beneath it.

It is believed that no screenable U.V. curable solder mask heretofore available is able to withstand the cross-hatch adhesion test described above. Consequently, it is believed that a printed circuit board having an adherent screened solder mask over copper following soldering, where adhesion is defined as cross-hatch adhesion, is a new article of manufacture. Likewise, it is believed what has been stated for adhesion between copper and the solder mask is also true for adhesion between solder and a solder mask, and consequently, it is believed that a printed circuit board having an adherent solder mask over solder following a soldering operation is also a new article of manufacture.

I claim:

1. A.U.V. curable coating composition comprising an acrylated or methacrylated oligomer in a concentration of from 30 to 70 weight percent of the composition, a photoinitiator in a concentration of from 1 to 12 weight percent of the composition and a monomer that is a mixture of an acrylate or methacrylate of an alkoxylated polyol having an average functionality of 2 or greater and a monofunctional ethylenically unsaturated compound having a single terminal ethylenic group, each in a concentration of from 5 to 35 percent of the composition.

2. The composition of claim 1 wherein the acrylated or methacrylated oligomer is selected from the group of acrylated or methacrylated epoxies, polyesters, polyethers, polyurethanes and mixtures thereof.

3. The composition of claim 2 where the oligomer is an aryloxyalkyl acrylate conforming to the formula:

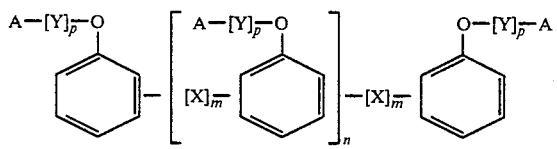

wherein X may be methylene, an alkyl-substituted methylene group, a dialkyl-substituted methylene group, a carbonyl group, a sulfide, a sulfoxide, a sulfone, an amine, an alkyl-substituted amine, and an alkalene ether wherein each alkyl group of each alkyl substituted group has from 1 to 8 carbon atoms, or any combination thereof; Y is thyl, lower alkyl or hydroxyalkyl where each alkyl group has up to 8 carbon atoms; A is an unsaturated acryloxy group having from 3 to 18 carbons; n is an integer of from 0 through 20; m is 0 or 1; and p is 0 or 1.

4. The composition of claim 2 where the alkoxylated acrylate or methacrylate conforms to the structural formula:

$$[CH_2=CRCO_2((CH_2)_mO_p]_xY$$

where R is hydrogen or methyl; m is a positive integer of from 1 to 4; p is a positive number of 1 or greater; Y is the residue of a polyol having at least z hydroxyl groups where z is at least 3; and x is at least 2, but not greater than z.

5. The composition of claim 4 where x and z are each 3.

6. The composition of claim 4 where m is 2.

7. The composition of claim 4 where m is 3.

8. The composition of claim 4 where the alkoxylated acrylate or methacrylate is the reaction product of propoxylated trimethylol propane and acrylic acid.

9. The composition of claim 4 where the alkoxylated acrylate or methacrylate is the reaction product of ethoxylated trimethylol propane and acrylic acid.

10. The composition of claim 4 where the ethylenically unsaturated compound is an alkyl acrylate or methacrylate.

11. The composition of claim 10 where the compound has an aliphatic $C_4$ to $C_{10}$ group.

12. The composition of claim 11 where the compound is a cycloalkyl acrylate.

13. The composition of claim 11 where the compound is selected from the group of 2-ethylhexyl acrylate, cyclohexyl acrylate, dicyclopentyl methacrylate, isodecyl acrylate and n-vinyl pyrrolidone.

14. The composition of claim 1, 3 or 10 as a cured coating over a substrate.

15. The composition of claim 14 where the substrate is a printed circuit.

16. A U.V. curable solder mask composition comprising an acrylated or methacrylated oligomer in a concentration of from 30 to 70 weight percent of the composition, a photoinitiator in a concentration of from 1 to 12 weight percent of the composition, a monomer that is a mixture of an acrylate or methacrylate of an alkoxylated polyol having an average functionality of 2 or greater and a monofunctional ethylenically unsaturated compound having a single terminal ethylenic group, each in a concentration of from 5 to 35 percent of the composition and a filler where at least 50 percent of the particles are elongated in a concentration of from 10 to 70 weight percent of the other components of the composition.

17. The composition of claim 16 where the acrylated or methacrylated oligomer is selected from the group of acrylated or methacrylated epoxies, polyester, polyethers, polyurethanes and mixtures thereof.

18. The composition of claim 17 where the oligomer is an aryloxyalkyl acrylate conforming to the formula:

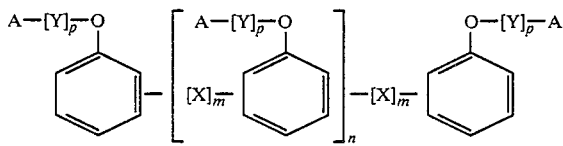

wherein X is methylene, an alkyl-substituted methylene group, a dialkyl-substituted methylene group, a carbonyl group, a sulfide, a sulfoxide, a sulfone, an amine, an alkyl-substituted amine, or an alkalene ether, wherein the alkyl group of each alkyl substituted group has from 1 to 8 carbon atoms, or any combination thereof; Y is thyl, lower alkyl or hydroxyalkyl, where each alkyl group has up to 8 carbon atoms; A may be an unsaturated acryloxy group having from 3 to 18 carbons; n is 0 through 20; m is 0 or 1; and p is 0 or 1.

19. The composition of claim 17 the alkoxylated acrylate or methacrylate conforms to the structural formula:

$$[CH_2{=}CRCO_2 ((CH_2)_m O_p]_x Y$$

where R is hydrogen or methyl; m is a positive integer of from 1 to 4; p is a positive number of 1 or greater; Y is the residue of a polyol having at least z hydroxyl groups where z is at least 3; and x is at least 2, but not greater than z.

20. The composition of claim 19 where x and z are each 3.

21. The composition of claim 19 where m is 2.

22. The composition of claim 19 where m is 3.

23. The composition of claim 19 where the alkoxylated acrylate or methacrylate is the reaction product of propoxylated trimethylol propane and acrylic acid.

24. The composition of claim 19 where the alkoxylated acrylate or methacrylate is the reaction product of ethoxylated trimethylol propane and acrylic acid.

25. The composition of claim 19 the ethylenically unsaturated compound is an alkyl acrylate or methacrylate.

26. The composition of claim 25 where the compound has an aliphatic $C_4$ to $C_{10}$ group.

27. The composition of claim 26 where the compound is selected from the group of 2-ethylhexyl acrylate, cyclohexyl acrylate, dicyclopentyl methacrylate, isodecyl acrylate and n-vinyl pyrrolidone.

28. The composition of claim 19 where the filler comprises particles having an average aspect ratio of at least 2 to 1.

29. The composition of claim 28 where the ratio is at least 4 to 1.

30. The composition of claim 28 where the filler is platy, acicular or fibrous.

31. The composition of claim 28 where the filler is selected from the group of talc, micas and mixtures thereof.

32. An article of manufacture comprising a substrate having the composition of claims 16 or 19 as a cured coating thereover.

* * * * *